US010001534B2

United States Patent
Okamoto

(10) Patent No.: US 10,001,534 B2
(45) Date of Patent: Jun. 19, 2018

(54) MAGNETIC RESONANCE IMAGING APPARATUS AND RADIO COMMUNICATION DEVICE

(71) Applicant: TOSHIBA MEDICAL SYSTEMS CORPORATION, Otawara-Shi, Tochigi-Ken (JP)

(72) Inventor: Kazuya Okamoto, Saitama (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 790 days.

(21) Appl. No.: 14/045,348

(22) Filed: Oct. 3, 2013

(65) Prior Publication Data

US 2014/0062485 A1    Mar. 6, 2014

Related U.S. Application Data

(63) Continuation of application No. PCT/JP2013/071115, filed on Aug. 5, 2013.

(30) Foreign Application Priority Data

Sep. 3, 2012  (JP) .................................. 2012-193326

(51) Int. Cl.
*G01V 3/00* (2006.01)
*G01R 33/24* (2006.01)
(Continued)

(52) U.S. Cl.
CPC ......... *G01R 33/24* (2013.01); *G01R 33/3692* (2013.01); *G01R 33/3415* (2013.01)

(58) Field of Classification Search
CPC ............................ G01R 33/24; G01R 33/3692
See application file for complete search history.

(56) References Cited

U.S. PATENT DOCUMENTS

2006/0226841 A1* 10/2006 Boskamp ........... G01R 33/3692
324/322
2008/0143332 A1* 6/2008 Hergt ................. G01R 33/3415
324/318
(Continued)

FOREIGN PATENT DOCUMENTS

CN         101325427 A     12/2008
JP          5-261083 A     10/1993
(Continued)

OTHER PUBLICATIONS

Williams, et al, Toshiba Shows Its First TransferJet Prototypes, 2009.*
CN Office Action dated Aug. 5, 2015 in in CN 201380002224.X.
English Translation of International Preliminary Report on Patentability dated Mar. 3, 2015 for Application No. PCT/JP2013/071115.
JP-language International Search Report for PCT/JP2013/071115, dated Sep. 24, 2013.
JP Office Action dated Jul. 19, 2016 in JP 2012-193326.

*Primary Examiner* — Daniel Miller
(74) *Attorney, Agent, or Firm* — Nixon & Vanderhye P.C.

(57) ABSTRACT

According to one embodiment, an MRI apparatus includes a first radio communication unit, a second radio communication unit and an image reconstruction unit. The first radio communication unit includes a connecting unit detachably connected to an RF coil device which detects a nuclear magnetic resonance signal emitted from an object. The first radio communication unit acquires the nuclear magnetic resonance signal detected by the RF coil device via the connecting unit, and wirelessly transmits the acquired nuclear magnetic resonance signal. The second radio communication unit receives the nuclear magnetic resonance signal wirelessly transmitted from the first radio communication unit. The image reconstruction unit acquires the nuclear magnetic resonance signal received by the second radio communication unit, and reconstructs image data of the object based on the nuclear magnetic resonance signal.

13 Claims, 8 Drawing Sheets

(51) Int. Cl.
  *G01R 33/36*   (2006.01)
  *G01R 33/3415*  (2006.01)

(56) References Cited

U.S. PATENT DOCUMENTS

| | | | |
|---|---|---|---|
| 2008/0311849 A1 | 12/2008 | Washiro | |
| 2009/0058420 A1 | 3/2009 | Adachi et al. | |
| 2010/0072997 A1* | 3/2010 | Fischer | G01R 33/3621 |
| | | | 324/309 |
| 2011/0012598 A1* | 1/2011 | van Helvoort | G01R 33/34 |
| | | | 324/318 |
| 2011/0227574 A1 | 9/2011 | Akita et al. | |
| 2012/0187949 A1* | 7/2012 | Biber | G01R 33/3621 |
| | | | 324/322 |

FOREIGN PATENT DOCUMENTS

| | | |
|---|---|---|
| JP | 9-98960 | 4/1997 |
| JP | 2008-149140 A | 7/2008 |
| JP | 2009-72580 | 4/2009 |
| JP | 2009-518098 | 5/2009 |
| JP | 2010-29644 | 2/2010 |
| JP | 2011-248767 | 12/2011 |
| WO | WO 2007/066250 | 6/2007 |

* cited by examiner

MAGNETIC RESONANCE IMAGING APPARATUS AND RADIO COMMUNICATION DEVICE

CROSS-REFERENCE TO RELATED APPLICATIONS

This application is a Continuation Application of No. PCT/JP2013/71115, filed on Aug. 5, 2013, and the PCT application is based upon and claims the benefit of priority from Japanese Patent Application No. 2012-193326, filed on Sep. 3, 2012, the entire contents of which are incorporated herein by reference.

BACKGROUND OF THE INVENTION

1. Field of the Invention

Embodiments described herein relate generally to a magnetic resonance imaging apparatus and a radio communication device.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal. Here, an RF (Radio Frequency) coil device is a device which transmits an RF pulse to nuclear spin inside an object by, for example, supplying a coil with an RF pulse electric current and detects generated MR signals.

Some of RF coil devices are built-in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of channels is set to be equal to or smaller than the input reception number of the RF receiver, a large number of RF coil devices can be connected to an MRI apparatus.

If the number of cables between an RF coil device and an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus. if it is impossible to enlarge the radio output power, dynamic range degrades due to signal loss caused when transmitted signals travel space. Then, in Japanese Patent Application Laid-open (KOKAI) Publication No. 2010-29664, digital radio communication method in which MR signals are digitized and then transmitted wirelessly is proposed.

The problem of restriction of dynamic range can be solved by wirelessly transmitting MR signals after digitalization. in this case, a method which requires the least expense is desired. More specifically, if a conventional RE coil device which transmits MR signals to a control side of an MRI apparatus by wired transmission can be used for the digital radio communication of MR signals without change on the conventional RE coil device, there is no necessity to purchase another RE coil device for the digital radio communication.

Therefore, novel technology to enable use of a conventional RF coil device performing wired transmission of MR signals to a control side of an MRI apparatus in a structure of wirelessly transmitting MR signals detected in an RF coil device to the control side of an MRI apparatus has been desired.

DETAILED DESCRIPTION

Figure 1:
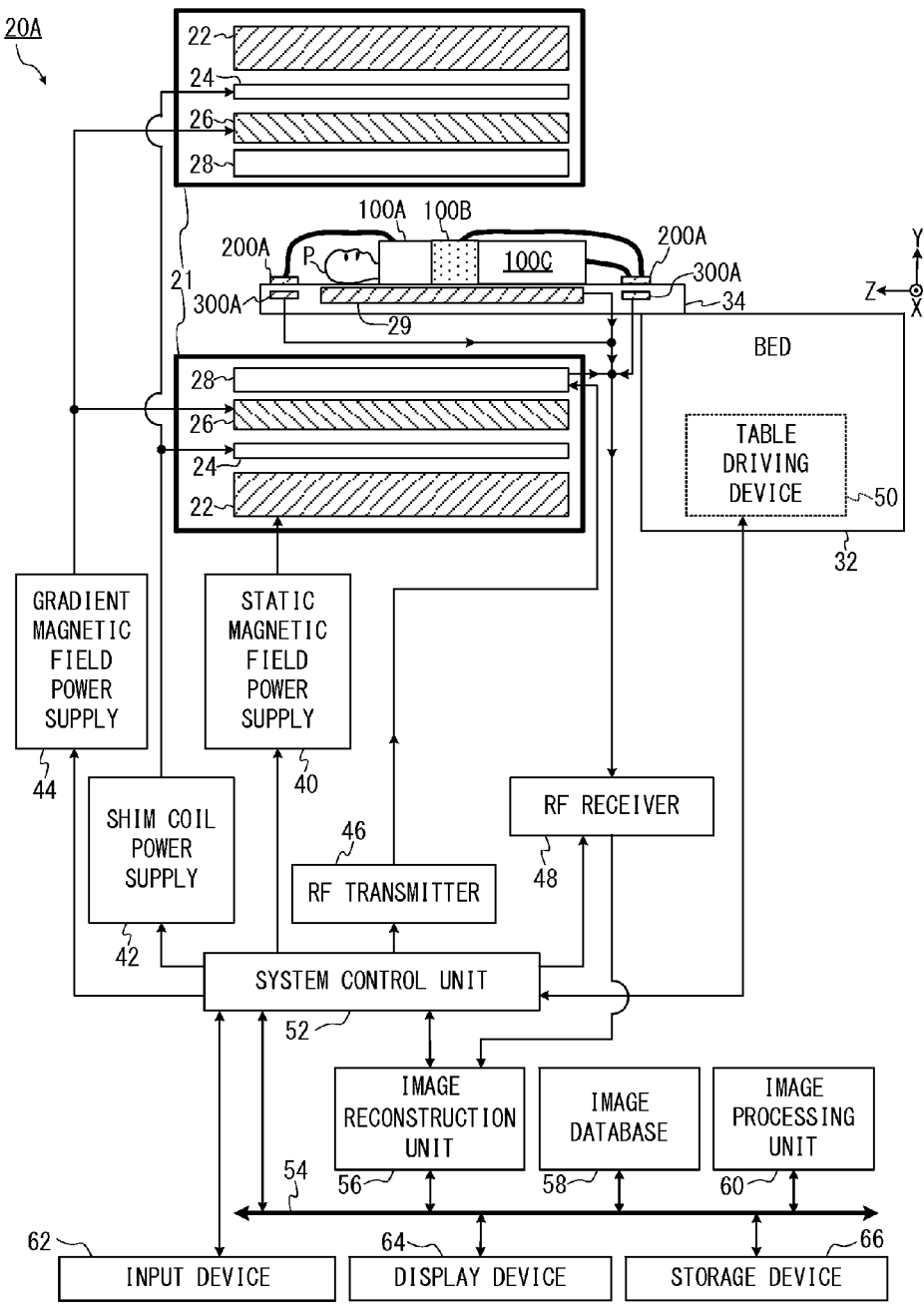
FIG. 1 is a block diagram showing an example of general structure of the MRI apparatus of the first embodiment.

In order to achieve the aforementioned assignment, the inventor has worked out a (digital) radio communication device which includes a connecting unit detachably connected to an RF coil device, acquires an MR signal detected in the RF coil device via the connecting unit, digitizes the MR signal and wirelessly transmits the digitized MR signal. Even in the case of a conventional RF coil device which is linked to a connection port of an MRI apparatus and outputs analogue MR signals via the connection port by wired transmission, this conventional RF coil device can perform digital radio transmission of MR signals if it is connected to the above radio communication device.

Hereinafter, examples of aspects which embodiments of the present invention can take will be explained per aspect.

(1) According to one embodiment, an MRI apparatus acquires an MR signal from an RF coil device that detects the MR signal emitted from an object, and this MRI apparatus includes a first radio communication unit, a second radio communication unit and an image reconstruction unit.

The first radio communication unit includes a connecting unit detachably connected to the RF coil device, acquires the MR signal detected by the RF coil device via the connecting unit, and wirelessly transmits the MR signal.

The second radio communication unit receives the MR signal wirelessly transmitted from the first radio communication unit.

The image reconstruction unit acquires the MR signal received by the second radio communication unit, and reconstructs image data of the object based on the acquired MR signal.

(2) According to one embodiment, a radio communication device includes a connecting unit and a radio communication unit.

The connecting unit is detachably connected to an RF coli device which detects an MR signal emitted from an object during implementation term of magnetic resonance imaging.

The radio communication unit acquires the MR signal detected by the RF coli device via the connecting unit, and wirelessly transmits the MR signal.

Examples of embodiments of magnetic resonance imaging apparatuses, radio communication devices and magnetic resonance imaging methods to which the aforementioned configuration is applied will be concretely described with reference to the accompanying drawings as follows.

In the first embodiment, an example of applying the above configuration to 'a novel technology in which the respective units of the transmission side and the receiving side are closely fixed to each other and short-distance radio communication via an induced electric field is performed' will be explained.

In the second embodiment, an example of applying the above configuration to remote radio communication similar to the structure described in Japanese Patent Application Laid-open (KOKAI) Publication No. 2010-29664 will be explained.

Note that the same reference numbers are given for identical components in each figure, and overlapping explanation is abbreviated.

<The First Embodiment>

FIG. 1 is a block diagram showing an example of general structure of the MRI apparatus 20A according to the first embodiment. As shown in FIG. 1, the MRI apparatus 20A includes a gantry 21, a bed 32 and a table 34 on the bed 32. In addition, in the gantry 21 which is cylinder-shaped as an example, the MRI apparatus 20A includes a static magnetic field magnet 22, a shim coil 24, a gradient magnetic field coil 26 and a transmission RF coil 28. The gantry 21 corresponds to the parts indicated as bold line frames in FIG. 1.

An object P is set on the table 34. The static magnetic field magnet 22 and the shim coil 24 are, for example, cylinder-shaped. Inside the static magnetic field magnet 22, the shim coil 24 is arranged so as to become coaxial with the static magnetic field magnet 22.

As an example here, an apparatus coordinate system, whose X axis, Y axis and Z axis are perpendicular to each other, is defined as follows.

Firstly, it is assumed that the static magnetic field magnet 22 and the shim coil 24 are arranged in such a manner that their axis direction accords with the vertical direction. And the direction of the axis of the static magnetic field magnet 22 and the shim coil 24 is defined as the Z axis direction. In addition, it is assumed that the vertical direction is the same as the Y axis direction. Moreover, it is assumed that the table 34 is disposed in such a position that the direction of the normal line of the loading plane thereof is the same as the Y axis direction.

The MRI apparatus 20A includes, on its control side, a static magnetic field power supply 40, a shim coil power supply 42, a gradient magnetic field power supply 44, an RF transmitter 46, an RF receiver 48, a table driving device 50, a system control unit 52, a system bus 54, an image reconstruction unit 56, an image database 58, an image processing unit 60, an input device 62, a display device 64 and a storage device 66. Incidentally, the table driving device 50 is arranged inside the bed 32.

The static magnetic field magnet 22 forms a static magnetic field in an imaging space by using electric current supplied from the static magnetic field power supply 40. The aforementioned imaging space means, for example, a space in the gantry 21 in which the object P is placed and to which a static magnetic field is applied.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 is, for example, arranged in the form of a cylinder inside the static magnetic field magnet 22. The gradient magnetic field coil 26 generates a gradient magnetic field Gx in the X axis direction, a gradient magnetic field Gy in the Y axis direction and a gradient magnetic field Gz in the Z axis direction in the imaging region, by using electric current supplied from the gradient magnetic field power supply 44.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining the gradient magnetic fields Gx, Gy and Gz in the three axes of the apparatus coordinate system.

Note that, the above "imaging region" means, for example, a region set as a part of the imaging space and is a range of acquisition of MR signals used to generate one image or one set of images. Here, alone set of images means, for example, a plurality of images when MR signals of the plurality of images are acquired in a lump in one pulse sequence such as multi-slice imaging. The imaging region is defined three-dimensionally in an apparatus coordinate system, for example.

The RF transmitter 46 generates RF pulses in accordance with control information provided from the system control unit 52, and transmits the generated RF pulses to the transmission RF coil 28. The transmission RF coil 28 transmits RF pulses given from the RF transmitter 46 to the object P. The transmission RF coil 28 also includes a whole body coil (not shown) which is built-in the gantry 21 and used for both transmission of RF pulses and detection of MR signals.

Moreover, the MRI apparatus 20A includes RF coil devices 100A, 100B and 100C, a reception RF coil 29, a plurality of coil side radio communication devices 200A and a plurality of control side radio communication devices 300A.

The reception RF coil 29 and the plurality of the control side radio communication devices 300A are disposed inside the table 34. The reception RF coil 29 detects MR signals generated due to excited nuclear spin inside the object P caused by the RF pulse, and transmits the detected MR signals to the RF receiver 48.

The RF coil device 100A is set on the chest part of the object P, and detects the MR signals from the chest part. The RF coil device 100B is set on the pelvic part of the object P, and detects the MR signals from the pelvic part. The RF coil device 100C is set on the lower limbs of the object P, and detects the MR signals from the lower limbs.

The RF coil devices 100A, 100B and 100C are wearable local coil for receiving MR signals, and may be the same structure as a conventional type. That is, each of the RF coil devices 100A, 100B and 100C includes a cable 102 (see FIGS. 2 and 3) and a connector 101 on one end of the cable 102 (see later-described FIG. 3). When the RF coil devices 100A, 100B and 100C are used for a conventional type MRI apparatus, each connector 101 is connected to a connection port of the MRI apparatus. Thereby, the RF coil devices 100A, 100B and 100C can transmit the MR signals detected from the object P as analogue signals by wired transmission to a control side of the MRI apparatus.

The MRI apparatus 20A of the first embodiment differs in that it transmits digitized MR signals from the side of the RF coil devices 100A, 100B and 100C to the control side (the RF receiver 48 side) of the MRI apparatus 20A by short-distance radio communication via an induced electric field, from conventional technology. Thus, each connector 101 of the RF coil devices 100A, 100B and 100C is detachably connected to a connection port 201 (see later-described FIG. 2 and FIG. 3) of the coil side radio communication device 200A. The above "connection" means both of mechanical connection (fixation) and interconnection by fixed line in terms of hard-wiring.

Each of the coil side radio communication devices 200A is closely fixed to one of the control side radio communication devices 300A that becomes the communication target. The respective coil side radio communication devices 200A acquire the analogue MR signals detected by the RF coil devices 100A, 100B and 100C via the connection ports 201 and the connectors 101, and digitize the analogue MR signals. The respective coil side radio communication devices 200A wirelessly transmit the digitized MR signals to the control side radio communication devices 300A as the communication target via an induced electric field. Operation of the radio communication will be described later.

As an example here, each of these RF coil devices 100A, 100B and 100C is interpreted as a part of the MRI apparatus 20A. However, these RF coil devices 100A, 100B and 100C may be interpreted as separated components from the MRI apparatus 20A.

Incidentally, though various wearable RF coil devices such as a shoulder RF coil device and so on can be used for detection of MR signals in the MRI apparatus 20A, imaging from the chest to the lower limbs will be explained as an example here.

In addition, though only two of the control side radio communication devices 300A are shown in FIG. 1 for the sake of avoiding complication, the number of the control side radio communication devices 300A may be three or more than three. However, configuration of including many of the separately arranged control side radio communication devices 300A is more preferable than configuration of including few control side radio communication devices 300A. This is because the former has more choices to closely fix the coil side radio communication device 200A to the control side radio communication device 300A.

In other words, if there are more choices of a fixing position, the coil side radio communication device 200A can be fixed to the control side radio communication device 300A which is nearest to the RF coil devices 100A, 100B or 100C. If it is fixed in such a manner, the cable 102 between the RF coil device (100A, 100B or 100C) and the coil side radio communication device 200A can be shortened.

Note that, the aforementioned "closely fix" means, for example, to fix mutually immovably within a range (distance) of being mutually electromagnetically coupled so as to be capable of the radio communication via an induced electric field.

In addition, as an example in the present embodiment, transmission of an RF pulse to the transmission RF coil 28 inside the MRI apparatus 20A and transmission of the MR signals detected from the object P are performed under wire transmission except the pathway between the coil side radio communication devices 200A and the control side radio communication devices 300A.

The RF receiver 48 generates complex number data of digitized MR signals (hereinafter, referred to as raw data of MR signals) by performing predetermined signal processing. The RF receiver 48 inputs the generated raw data of MR signals to the image reconstruction unit 56.

The system control unit 52 performs system control of the entirety of the MRI apparatus 20A in imaging operation and image display after imaging operation via interconnection lines such as the system bus 54.

For achieving the above control, the system control unit 52 stores control information needed in order to make the gradient magnetic field power supply 44, the RF transmitter 46 and the RF receiver drive. The aforementioned "control information" includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 according to a predetermined sequence stored.

In addition, the system control unit 52 can change the height of the bed 32 so as to move up and down the table 34 in the Y axis direction by controlling the table driving device 50, when the table 34 is at a predetermined position outside the gantry 21. In addition, the system control unit 52 makes the table 34 move into and out of the imaging space in the gantry 21 in the Z axis direction by controlling the table driving device 50. The system control unit 52 locates the imaging part of the object P near to the center of the magnetic field in the imaging space by controlling the position of the table 34 in the above manner.

In addition, the system control unit 52 functions as an imaging condition setting unit. That is, the system control unit 52 sets the imaging conditions of the main scan based on some of the imaging conditions and information inputted to the input device 62 by a user. For achieving this, the system control unit 52 makes the display device 64 display screen information for setting imaging conditions.

The input device 62 provides a user with a function to set imaging conditions and image processing conditions.

The aforementioned term "imaging condition" refers to under what condition an RF pulse or the like is transmitted in what type of pulse sequence, or under what condition MR signals are acquired from the object P, for example.

As a parameter of the imaging conditions, for example, there are the imaging region as positional information in the imaging space, an imaging part, the type of the pulse sequence such as parallel imaging, the type of RE coil devices used for imaging, the number of slices, an interval between respective slices.

The above "imaging part" means a region of the object P to be imaged as an imaging region, such as a head, a chest and an abdomen.

The aforementioned "main scan" is a scan for imaging an intended diagnosis image such as a proton density weighted image, and it does not include a scan for acquiring MR signals for a scout image or a calibration scan. A scan is an operation of acquiring MR signals, and it does not include image reconstruction processing. The calibration scan is a scan for determining unconfirmed elements of imaging conditions, conditions and data used for image reconstruction processing and so on, and it is performed separately from the main scan. The after-mentioned "prescan" is a calibration scan which is performed before the main scan.

The image reconstruction unit 56 converts the raw data of MR signals inputted from the RF receiver into, for example, matrix data based on a phase encode step number and a frequency encode step number, and stores the converted data as k-space data. The k-space means a frequency space (Fourier space). The image reconstruction unit 56 generates image data of the object P by performing image reconstruction processing including such as two-dimensional Fourier transformation on the k-space data. The image reconstruction unit 56 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display device 64 displays a screen for setting imaging conditions of the main scan and images indicated by generated image data under control of the system control unit 52.

Figure 2:
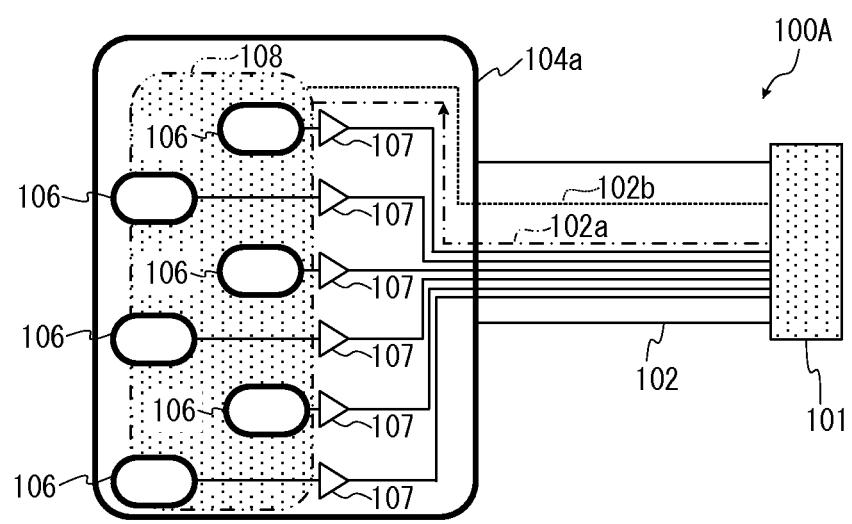
FIG. 2 is a schematic planimetric diagram showing an example of structure of the RF coil device 100A in FIG. 1.

FIG. 2 is a schematic planimetric diagram showing an example of structure of the RF coil device 100A in FIG. 1. As shown in FIG. 2, the RF coil device 100A includes the connector 101, the cable 102 and a cover member 104a. The cover member 104a is made of a flexible material and is capable of deformation such as folding. As such a deformable (flexible) material, for example, a flexible circuit board (Flexible Printed Circuit: FPC) described in Japanese Patent Application Laid-open (KOKAI) Publication No. 2007-229004 can be used.

Inside the cover member 104a, a plurality of coil elements (surface coils) 106 functioning as antennas which respectively detect MR signals from the object P are disposed. Although six coil elements 106 are shown in FIG. 2 as an example here, the number or shape of the coil elements 106 are not limited to the shown number or shape.

In addition, inside the cover member 104a, six preamplifiers 107 respectively corresponding to the six coil elements 106 are disposed. Each of the preamplifiers 107 amplifies the MR signals detected by the corresponding coil element 106, and outputs the amplified MR signals. Note that, a bandpass filter and so on may be inserted in series between each preamplifier 107 and the connector 101.

Figure 5:
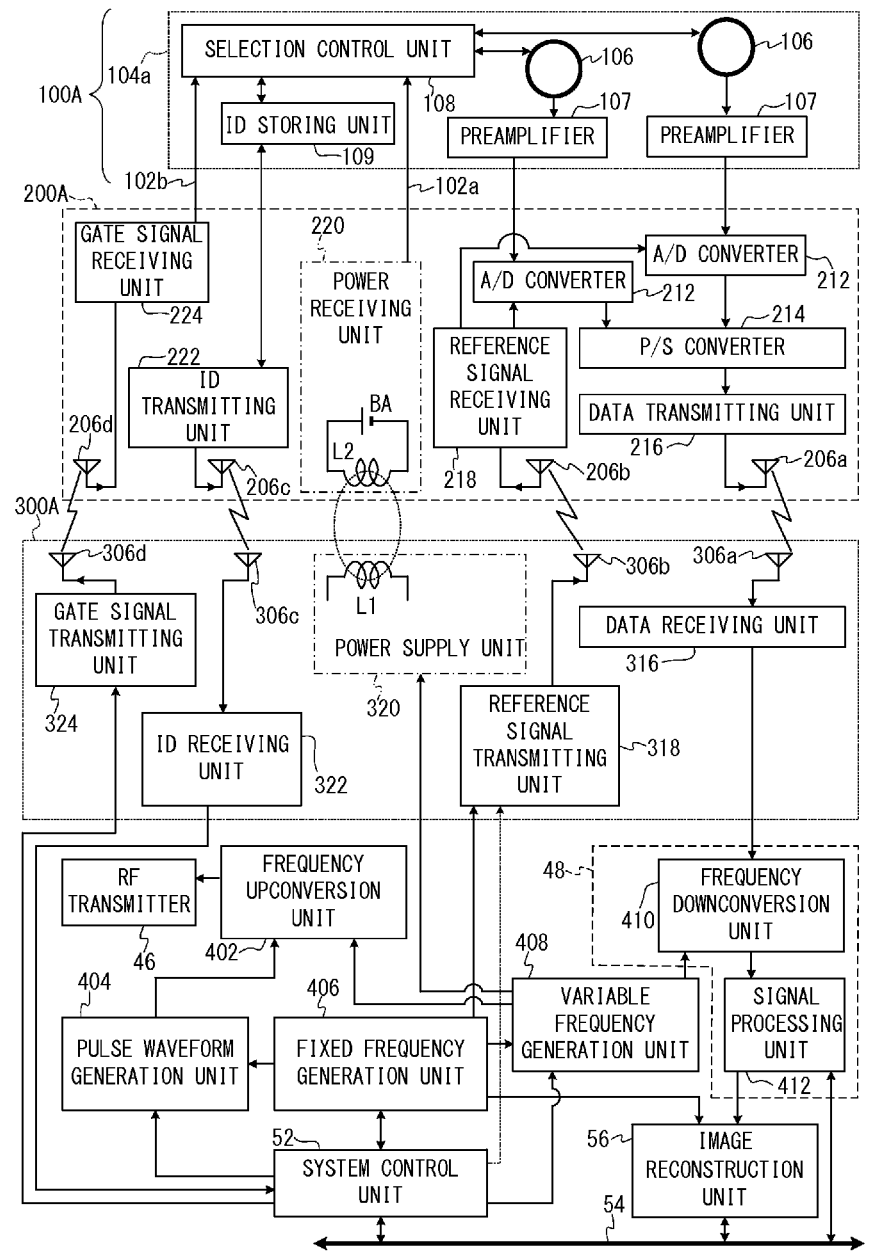
FIG. 5 is a schematic block diagram showing the functions of the respective units relevant to transmission of the MR signals detected by the coil elements of the RF coil device 100A in the first embodiment.

In addition, inside the cover member 104a, the RF coil devices 100A includes a selection control unit 108 and an ID (identification information) storing unit 109 (see after-mentioned FIG. 5). The selection control unit 108 controls the operation of the RF coil devices 100A such as which of the six coil elements 106 are selected for detection (reception) of MR signals.

Inside the cable 102, six signal lines of the MR signals respectively corresponding to the preamplifiers 107 inside the cover member 104a, a power line 102a and a control signal line 102b are included.

The connector 101 is detachably connected (interdigitated) with i.e., fitted into a connection port of a conventional type MRI apparatus and the connection port 201 of the coil side radio communication device 200A (e.g., see FIG. 3) of the MRI apparatus 20A of the present embodiment. The connector 101 is electrically connected to hard wirings inside the connection port in the interdigitated state.

The RF coil device 100B has the same structure as the above RF coil device 100A, except that (A) its cover member 104b (see FIG. 3) is formed so as to be easily set on the pelvic part and (B) the shape and arrangement of its coil elements are configured to suit detection of the MR signals from the pelvic part.

The RF coil device 100C has the same structure as the above RF coil device 100A, except that (A) its cover member 104c (see FIG. 3) is formed so as to be easily set on the lower limbs and (B) the shape and arrangement of its coil elements are configured to suit detection of the MR signals from the lower limbs.

Figure 3:
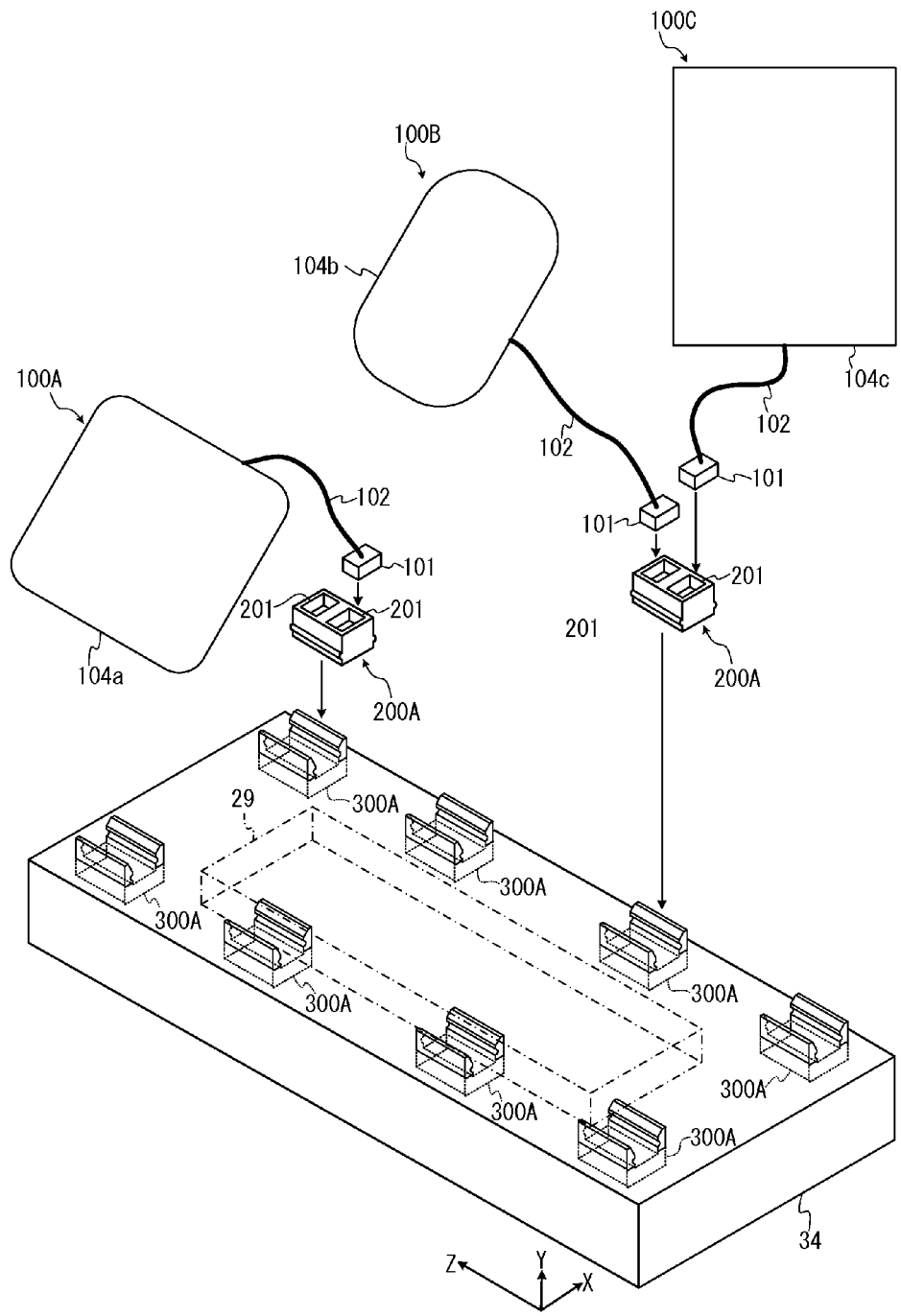
FIG. 3 is a schematic diagram showing an example of connection of the RF coil devices 100A, 100B and 100C in FIG. 1.

FIG. 3 is a schematic diagram showing an example of the connection of the RF coil devices 100A, 100B and 100C in FIG. 1. Each of the coil side radio communication devices 200A includes two connection ports 201. Each of the connection ports 201 is in the form of detachably interdigitating the connector 101 on one end of the cable 102 of each of the RF coil devices 100A, 100B and 100C.

As an example in FIG. 3, the connector 101 of the RF coil device 100A is connected to one connection port 201 of one coil side radio communication device 200A. In addition, the connector 101 of the RF coil device 100B and the connector 101 of the RF coil device 100C are connected to the respective connection ports 201 of another coil side radio communication device 200A.

In addition, as an example in FIG. 3, eight of the control side radio communication devices 300A are arranged on the side of the loading plane for setting the object P of the table 34 so as to be partially embedded in the table 34. The object P is, for example, set in the middle of the width direction (the X axis direction in the apparatus coordinate system) of the table 34. Thus, in this example, on both end sides in the width direction of the table 34, four of the control side radio communication devices 300A are respectively arranged along the longer direction of the table 34 (the Z axis direction) in a row at intervals.

Note that, the number or arrangement position of the control side radio communication devices 300A is not limited to that of FIG. 3. For example, the control side radio communication devices 300A may be disposed on the table 34 or on the gantry 21 so as to be completely exposed. Alternatively, the control side radio communication devices 300A may be completely embedded in the table 34. Alternatively, the control side radio communication devices 300A may be disposed inside the gantry 21 or on the bed 32.

The coil side radio communication device 200A connected to the RF coil devices 100A is closely fixed to one of the control side radio communication devices 300A, and the coil side radio communication device 200A connected to the RF coil devices 100B and 100C is closely fixed to another of the control side radio communication devices 300A. The fixing method will be explained later with FIG. 4.

Although only two coil side radio communication devices 200A are shown in FIG. 3 for the sake of avoiding complication, the number of the coil side radio communication devices 200A may be three or more than three. Thus, the RF coil devices 100A, 100B and 100C may be connected to three coil side radio communication devices 200A respectively, and these three coil side radio communication devices 200A may be closely fixed to three of the control side radio communication devices 300A respectively.

In addition, the number of the connection ports 201 in each of the coil side radio communication devices 200A may be one, three, or more than three, However, considering a case of using a plurality of RF coil devices for imaging, the number of the connection ports 201 in each of the coil side radio communication devices 200A is preferably plural.

Figure 4:
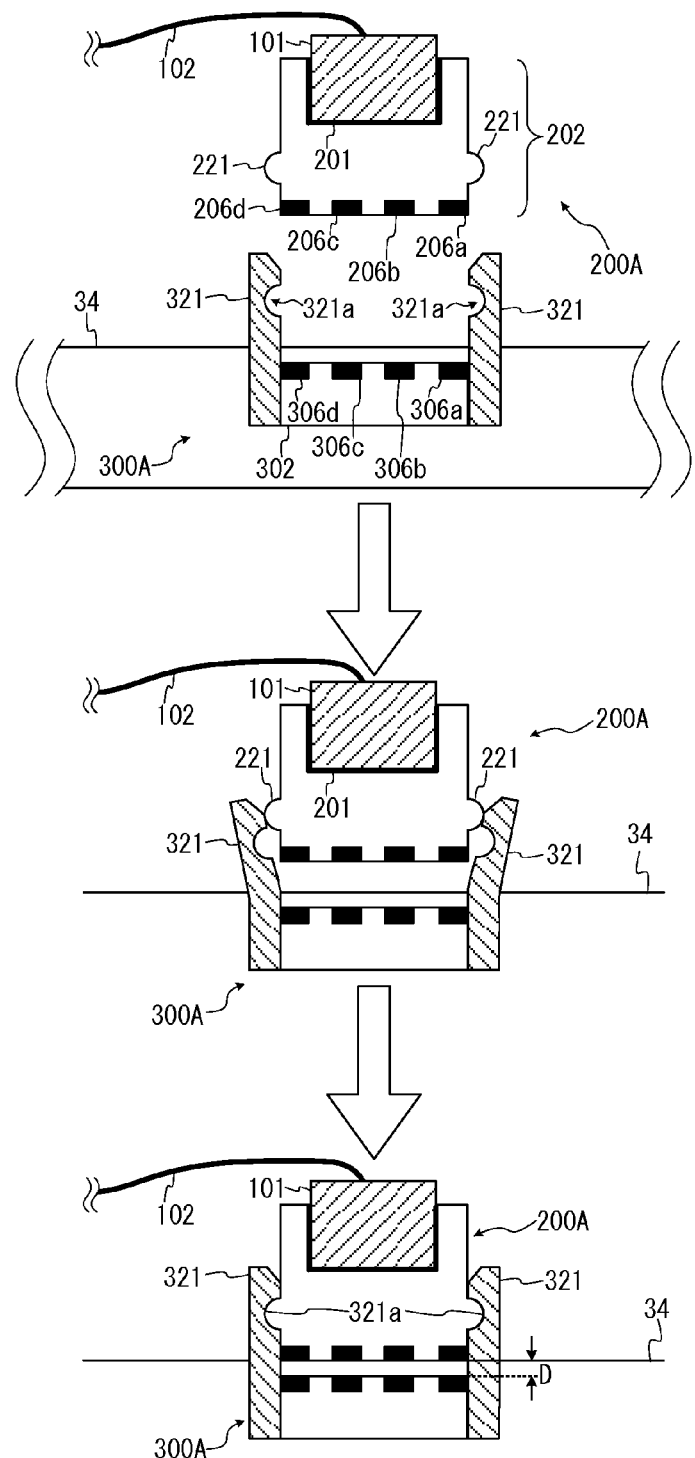
FIG. 4 is a schematic cross-sectional diagram showing an example of fixing a coil side radio communication device to a control side radio communication device.

FIG. 4 is a schematic cross-sectional diagram showing an example of fixing the coil side radio communication device 200A to the control side radio communication device 300A. FIG. 4 shows a state in which the connector 101 (diagonally left down shadow area) of the RF coil device (100A, 100B or 100C) is connected to the connection port 201 (heavy line part) formed on the chassis 202 of the coil side radio communication device 200A. As shown in the upper part of FIG. 4, for example, two bumps 221 are formed on the chassis 202 of the coil side radio communication device 200A. Although other components such as an A/D (analog to digital) converter 212 are included inside the chassis 202, their details will be explained later with FIG. 5.

In order to smoothen insertion and detachment of the coil side radio communication device 200A, each bump 221 is shaped in such a manner that its transverse section becomes a semicircle. This is because smoothly chamfered surfaces of the bumps 221 make it easier to insert the coil side radio communication device 200A than bumpy surfaces thereof, in general. The bumps 221 may be spherical, for example. Alternatively, the bumps 221 may be in the form of a bisected cylinder divided along its axis direction. As an example here, the chassis 202 which includes the bump 221 is assumed to be made of undeformable nonmagnetic material in order to avoid influence on wireless radio communication.

The control side radio communication device 300A includes two fixing plates 321. Both of the fixing plates 321 are respectively fixed to ambilateral side surfaces of the chassis 302 of the control side radio communication device 300A by, for example, adhesive bonding. Although other components such as a reference signal transmitting unit are included inside the chassis 302, their details will be explained later with FIG. 5.

Both fixing plates 321 are approximately in the form of a flat plate, for example, and disposed so as to face each other. As shown in the lower part of FIG. 4, each of the fixing plates 321 is shaped in the form of interdigitating the coil side radio communication device 200A. That is, dent parts 321a in the form of interdigitating the bump 221 are respectively chamfered on the mutually facing surfaces of the two, fixing plates 321 at a position corresponding to each of the bumps 221 (see the upper part of FIG. 4).

In addition, the end side (the side opposite to the chassis 302) of each of the fixing plates 321 is chamfered aslant in order to ease insertion of the coil side radio communication device 200A. As to the fixing plates 321, it is preferable to form them with elastic material of nonmagnetic body which can be curved to a degree shown in the middle part of FIG. 4. As such material, for example, plastic and synthetic resin can be used. The reason for forming them with nonmagnetic material is the same as before.

The control side radio communication device 300A is embedded behind the top surface of the table 34 for the depth of interval D (see the lower part of FIG. 4), for example. The interval D is an interval which enables the radio communication via an induced electric field. On the top (loading) surface of the table 34, ditches into which the fixing plates 321 can be inserted are formed, and the fixing plates 321 stick out of the top surface of the table 34 via these ditches.

In the above structure, the coil side radio communication device 200A is inserted into the control side radio communication device 300A from the state of the upper part of FIG. 4. At this insertion timing, as shown in the middle part of FIG. 4, each of the fixing plates 321 is bent in the direction of mutually separating. This is because the maximum width between both bumps 221 on the ambilateral side surfaces of the coil side radio communication device 200A is larger than the minimum width between both fixing plates 321.

Then, at the position where the basal plane of chassis 202 of the coil side radio communication device 200A has contact with the top surface of the table 34, both bumps 221 are respectively interdigitated with the dent parts 321a, and each of the fixing plates 321 returns to the original shape (shown in the upper part of FIG. 4 before insertion) by shape recovery force. Thereby, the coil side radio communication device 200A is detachably fixed to the control side radio communication device 300A on the table 34.

The coil side radio communication device 200A includes antennas 206a, 206b, 206c and 206d on the side of its rear surface (the side of the control side radio communication device 300A in the above fixed state). In addition, the control side radio communication devices 300A includes antennas 306a, 306b, 306c and 306d on the side of its top surface (the side of the coil side radio communication device 200A in the above fixed state). Each of the antennas 306a to 306d corresponds to each of the above antennas 206a to 206d so as to group into a pair (totally, four pairs). Out of the antennas 206a to 206d and 306a to 306d, at least the pathway between the antennas 206a and 306a is composed of, for example, later-described induced electric field combined couplers.

The antennas 206a to 206d are disposed so as to respectively face the antennas 306a to 306d in the state in which the coil side radio communication device 200A and the control side radio communication device 300A are closely fixed to each other in the above manner. When imaging is finished, the coil side radio communication device 200A is taken out of the fixing plated 321 so as to separate from the table 34.

Note that, the above interdigitation is only an example of methods of fixing the coil side radio communication device 200A, and other detachable fixing methods may be alternatively used. For example, out of the male side and the female side of a hook-and-loop fastener such as magic tape (Trademark), one side may be fixed to the top surface of the table 34 and the other side may be fixed to the rear surface of the coil side radio communication device 200A. When the top surface of the control side radio communication device 300A is exposed out of the top surface of the table 34, one side of the male side or the female side of a hook-and-loop fastener may be fixed to the top surface of the control side radio communication device 300A.

The radio communication via an induced electric field is performed on the pathway between the coil side radio communication device 200A and the control side radio communication device 300A. An induced electric field means an electric field caused by time change of magnetic flux density. As the short-distance radio communication via an induced electric field, for example, TransferJet (Trademark) which uses an induced electric field combined coupler as an antenna can be used (see Japanese Patent Application Laid-open (KOKAI) Publication No. 2010-147922, for example).

More specifically, the induced electric field combined coupler includes a coupling electrode, a resonance stub, a ground and so on (not shown). If an electric signal is inputted to the resonance stub of the transmission side, electric charges are accumulated in the coupling electrode, and virtual electric charges equal to the electric charges accumulated in the coupling electrode are generated in the ground. Thereby, a micro electrical dipole is composed by these electric charges, and this micro electrical dipole functions as a transmission side antenna. That is, data are transmitted to the receiving side via an induced electric field of a longitudinal wave generated by the micro electrical dipole. Because a longitudinal wave vibrating in parallel with the traveling direction is not influenced by the direction of an antenna, stable data transmission can be achieved.

However, if the receiving side is separated from the transmission side beyond limit, both sides are not electro-magnetically coupled and data transmission cannot be performed. This is because induced electric fields formed by the induced electric field combined couplers rapidly attenuate if the interval between both sides of the couplers becomes distant.

Although the antennas 206a to 206d are discretely disposed and the antennas 306a to 306d are discretely disposed in order to distinguish respective components in FIG. 4, interference between each of the four radio communication pathway can be avoided without arranging them separately. That is, the four radio frequencies respectively used in the pathway of the antennas 206a to 306, the pathway of the antennas 206b to 306b, the pathway of the antennas 206c to 306c and the pathway of the antennas 206d to 306d may be separated (their frequency values may be widely set apart). As to the radio communication frequency, it is preferable to avoid frequencies which are equal to numbers obtained by dividing a center frequency of RF pulses transmitted to the object P by a natural number, in each of the radio communication pathway.

It is preferable that installation positions of the control side radio communication devices 300A are not too deep from the surface of the table 34. If positions of the antennas 306a to 306d of each of the control side radio communication devices 300A in the table 34 are too deep, the interval D (see the bottom part of FIG. 4) between the transmission side and the receiving side cannot be close enough to electro-magnetically couple the antennas 206a to 206d of the transmission side to the antennas 306a to 306d of the receiving side. In this case, the radio communication via an induced electric field will be difficult to be achieved.

That is, it is preferable to dispose each of the control side radio communication devices 300A to such a position that each control side radio communication device 300A can be fixed to the coil side radio communication device 200A close enough to be electro-magnetically coupled to the coil side radio communication device 200A.

Note that, as long as an electric dipole (antenna) of the coil side radio communication device 200A side is not directly contacted to an electric dipole (antenna) of the control side radio communication device 300A side, the chassis covering the antennas of the coil side radio communication device 200A side may be contacted to the chassis covering the antennas of the control side radio communication device 300A side. This is because it is enough if the interval D causing an induced electric field is kept between the antennas of the transmission side and the antennas of the receiving side. Thus, the control side radio communication devices 300A may be exposed in such a manner that its surface of the antennas side becomes in line with the top surface of the table 34.

In addition, if imaging time is long, for example, 30 minutes, transmission span of the MR signals becomes long. During the transmission span, it is preferable to fix the transmission side and the receiving side each other so as not to jolt out of alignment. Thus, configuration of including a component which fixes the transmission side and the receiving side so as not to move each other is preferable like the present embodiment.

By equipping a fixing method, the MRI apparatus 20A becomes free from the possibility that the RF coil devices 100A, 100B and 100C set on the object P are moved by movement of the object P during imaging and this moves the coil side radio communication devices 200A, resulting in communication error of the MR signals detected from the object P.

FIG. 5 is a schematic block diagram showing the functions of the respective units relevant to transmission of the MR signals detected by the coil elements 106 of the RF coil device 100A in the first embodiment. Although only two of the coil elements 106 and two of the preamplifiers PMP inside the cover member 104a of the RF coil devices 100A are shown in FIG. 5 for the sake of avoiding complication, actually more number of the coil elements 106 and more number of the preamplifiers PMP are disposed (see FIG. 2).

As shown in FIG. 5, The coil side radio communication device 200A further includes a plurality of the A/D converters 212, a P/S (Parallel/Serial) converter, a data transmitting unit 216, a reference signal receiving unit 218, a power receiving unit 220, an ID (Identification Information) transmitting unit 222, a gate signal receiving unit 224. In addition, the power receiving unit 220 includes a rechargeable battery BA and a coil L2. Note that, though only two of the A/D converters 212 are shown in FIG. 5 for the sake of avoiding complication, actually the same number of the A/D converters 212 as the coil elements 106 are disposed, for example.

The control side radio communication device 300 further includes a data receiving unit 316, a reference signal transmitting unit 318, a power supply unit 320, an ID (Identification Information) receiving unit 322 and a gate signal transmitting unit 324. In addition, the power supply unit 320 includes a coil L1.

In addition, the control system of the MRI apparatus 20A further includes a frequency upconversion unit 402, a pulse waveform generation unit 404, a fixed frequency generation unit 406, a variable frequency generation unit 408, aside from the components shown in FIG. 1. In addition, the RF receiver 48 includes a frequency downconversion unit 410 and a signal processing unit 412.

As an example in the present embodiment, there are a region where an induced magnetic field for charging is generated and four radio communication pathways between the coil side radio communication device 200A and the control side radio communication device 300A. In the following, the above region and pathways will be explained in order.

Consider a case where the coil L2 of the power receiving unit 220 is located in a position close enough to be electromagnetically coupled to the coil L1 of the power supply unit 320 (i.e. a case where the coil side radio communication device 200A is closely fixed to the control side radio communication device 300). In this case, the power supply unit 320 supplies a primary current to the coil L1 so as to generate an induced magnetic field, and thereby electromotive force is caused in the coil L2. By this electromotive force, a secondary current flows the coil L2, and thereby the rechargeable battery BA is charged.

The power receiving unit 220 provides the electric power charged in the above manner to each component of the coil side radio communication device 200A via hard-wiring (not shown). In addition, the power receiving unit 220 provides the above electric power to each component inside the cover member 104a of the RF coil device 100A via the power line 102a. For the sake of avoiding complication, the entirety of the cable 102 shown in FIG. 2 is not shown in FIG. 5.

Here, as to the frequency of the primary current supplied to the coil L1, it is preferable to separate the frequency from each communication frequency used in the four radio communication pathways. This is so that signals in the four radio communication pathways between the antennas 206a to 206d and the antennas 306a to 306d are not interfered by the above primary current.

Note that, as a method of saving electric power of the RF coil device 100A, a rechargeable battery charged during unused span of the RF coil device 100A and the above power receiving unit 220 and the power supply unit 320 may be used in combination.

Next, the four radio communication pathways will be explained. Although the radio communication via an induced electric field is performed at least in the pathway between the antennas 206a and 306a, it may be performed in the pathway between the antennas 206b and 306, or the pathway between the antennas 206d and 306d.

Firstly, in the pathway between the antennas 206c and 306c, the identification information of the RF coil device 100A is transmitted from the coil side radio communication device 200A to the control side radio communication device 300A.

More specifically, for example, the ID transmitting unit 222 operates based on electric power wirelessly supplied from the ID receiving unit 322 of the control side radio communication device 300A which is the communication target. That is, if the ID receiving unit 322 gets close to the ID transmitting unit 222, the ID transmitting unit 222 acquires the identification information of the RF coil devices 100A stored in the ID storing unit 109, and automatically transmits the acquired identification information from the antenna 206c to the antenna 306c as a digital signal. This radio communication of the identification information may be performed in the same way as RFID (Radio Frequency Identification) typified by, for example, IC (Integrated Circuit) tag.

The ID receiving unit 322 inputs the identification information of the RF coil device 100A received by the antenna 306c to the system control unit 52. Thereby, the system control unit 52 recognizes information on which of various types of RF coil devices such as the chest part RF coil device and the pelvic part RF coil device is(are) currently connected.

Secondly, in the pathway between the antennas 306d and 206d, a gate signal is continuously wirelessly transmitted from the gate signal transmitting unit 324 of the control side radio communication device 300A to the gate signal receiving unit 224 of the coil side radio communication device 200A during imaging.

More specifically, as a switch changing on/off state of each coil element 106, for example, an active trap circuit including a PIN diode (p-intrinsic-n Diode) and so on are respectively disposed on the coil elements 106. The gate signal is a control signal of the above switch.

Note that, as an alternative configuration, a trigger signal may be transmitted from the gate signal transmitting unit 324 to the gate signal receiving unit 224 and the gate signal is generated inside the gate signal receiving unit 224 based on the trigger signal.

While RF pulses are transmitted to the object P, the gate signal inputted to the RF coil device 100A via the gate signal transmitting unit 324, the antenna 306d, the antenna 206d and the gate signal receiving unit 224 is generally set to on-level. During the on-level span of the gate signal, the above switch becomes off-state so as to disconnect the loop of each of the coil elements 106 and thereby each of the coil elements 106 cannot detect MR signals.

Except the span during which RF pulses are transmitted to the object P, the gate signal adjusted to off-level is wirelessly transmitted. While the gate signal is off-level, the above switch becomes on-state and each of the coil elements 106 can detect MR signals. Coupling effect between the transmission RF coil 28 which transmits RF pulses to the object P and the coil elements 106 which respectively detect the MR signals from the object P is prevented by the above on/off switching of the coil elements 106.

Thirdly, in the pathway between the antennas 306b and 206b, a digital reference signal is continuously wirelessly transmitted from the reference signal transmitting unit 318 of the control side radio communication device 300A to the reference signal receiving unit 218 of the coil side radio communication device 200A during imaging.

More specifically, the reference signal is a signal that synchronizes the coil side radio communication device 200A as a transmission side of the MR signals with a basic frequency of system based on the fixed frequency generation unit 406. The reference signal transmitting unit 318 generates the reference signal by performing processing such as modulation, frequency conversion, amplification and filtering on the criteria clock signal inputted from the fixed frequency generation unit 406.

The fixed frequency generation unit 406 generates the criteria clock signal whose frequency is constant. The fixed frequency generation unit 406 includes a crystal controlled oscillator with high degree of stability and so on, in order to generate the criteria clock signal.

The fixed frequency generation unit 406 inputs the criteria clock signal to the reference signal transmitting unit 318 and the variable frequency generation unit 408. In addition, the fixed frequency generation unit 406 inputs the criteria clock signal to respective components performing clock synchronization inside the MRI apparatus 20A such as the image reconstruction unit 56 and the pulse waveform generation unit 404.

The variable frequency generation unit 408 includes PLL (Phase-Locked Loop), DDS (Direct Digital Synthesizer), and a mixer. The variable frequency generation unit 408 operates based on the above criteria clock signal. The variable frequency generation unit 408 generates a local signal (clock signal) of variable frequency that accords with a setting value inputted from the system control unit 52 as a center frequency of RF pulses.

In order to achieve this, the system control unit 52 inputs a default value of the center frequency of the RF pulses to the variable frequency generation unit 408 before a prescan. In addition, the system control unit 52 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

In addition, a trigger signal (A/D conversion start signal) that determines timing of sampling in the A/D converters 212 inside the coil side radio communication device 200A is inputted from the system control unit 52 to the reference signal transmitting unit 318. The above sampling means, for example, to extract intensity of analog signal at regular time intervals so as to enable digital record. As an example here, the reference signal transmitting unit 318 wirelessly transmits both the reference signal and the trigger signal to the reference signal receiving unit 218, by superimposing the trigger signal on the reference signal.

Fourthly, in the pathway between the antennas 206a and 306a, the digitized MR signals are wirelessly transmitted from the data transmitting unit 216 of the coil side radio communication device 200A to the data receiving unit 316 of the control side radio communication device 300A via an induced electric field.

More specifically, the number of the coil elements 106, the number of the preamplifiers PMP, and the number of the A/D converters 212 are the same. Each of the preamplifiers PMP corresponds to each of the coil elements 106, and each of the A/D converters 212 corresponds to each of the coil elements 106.

Thus, the analogue MR signals detected by the coil elements 106 selected for detection (at least one of the plural coil elements 106) are respectively amplified by the corresponding preamplifiers PMP, and then inputted to the respective A/D converters 212. The signal transmission from each of the preamplifiers PMP to each of the A/D converters 212 goes through the cable 102, the connector 101, and the connection port 201.

The A/D converters 212 converts the analogue MR signals inputted from the preamplifiers PMP into digital signals. At this time, the reference signal and trigger signal are inputted to each of the A/D converters 212 from the reference signal receiving unit 218. Thus, each of the A/D converters 212 starts sampling and quantization based on the reference signal (sampling clock signal) in synchronization with the timing when the trigger signal is transmitted.

If at least one of coil elements 106 is not selected for detection, the preamplifier(s) PMP and the A/D converter(s) 212 corresponding to the unselected coil element(s) 106 do not operate as an example in the present embodiment.

Each of the A/D converters 212 inputs the digitized MR signals to the P/S converter 214. If a plurality of the coil elements 106 are selected for detection, the MR signals which have been detected by these coil elements 106 and have undergone A/D conversion respectively are plural. In this case, the P/S converter 214 converts these plural MR signals from parallel signals into a serial signal for radio transmission, and inputs the serial signal to the data transmitting unit 216. This is because the number of antenna for transmitting the MR signals is only one (the antenna 206a) in the example of the present embodiment.

However, the present embodiment is not limited to an aspect of transmitting the MR signals as a serial signal. For example, the MR signals may be wirelessly transmitted as parallel signals by increasing the number of antennas for transmitting and receiving MR signals.

The data transmitting unit 216 generates MR signals for radio transmission (which are serial signals and digital signals) by performing processing such as error correction encoding, interleave, modulation, frequency conversion, amplification, and filtering on the inputted serial MR signal. Because the short-distance radio transmission via an induced electric field is performed, the radio output intensity of the above MR signals does not need to be raised to as strong level as the radio output level of the remote radio communication described in Japanese Patent Application Laid-open (KOKAI) Publication No. 2010-29664. The antenna 206a wirelessly transmits the MR signals for radio transmission to the antenna 306a.

The data receiving unit 316 performs processing such as amplification, frequency conversion, demodulation, deinterleave and error correction decoding on the serial MR signals received by the antenna 306a. Thereby, the data receiving unit 316 extracts the original digitized MR signals from the MR signals for radio transmission, and inputs the extracted MR signals to the frequency downconversion unit 410 of the RF receiver 48.

The frequency downconversion unit 410 multiplies the MR signals inputted from the data receiving unit 316 by the local signal inputted from the variable frequency generation unit 408, and makes an arbitrary signal band get through by filtering. Thereby, the frequency downconversion unit 410 performs frequency conversion (downconversion) on the MR signals, and inputs the MR signals whose frequency is lowered to the signal processing unit 412.

The signal processing unit 412 generates raw data of the MR signals by performing predetermined signal processing on the above MR signals whose frequency is lowered. The raw data of the MR signals are inputted to the image reconstruction unit 56, and converted into k-space data and stored in the image reconstruction unit 56 as described earlier.

Note that, though the RF receiver 48 and the control side radio communication devices 300A are explained as mutually separate components in the above configuration, this is only an example. For example, the RF receiver 48 may be composed as a part of the control side radio communication devices 300A.

In addition, as to the gate signal, it may be superimposed on the reference signal in the way similar to the trigger signal. In this case, because the number of radio communication pathways can be decreased by one by omitting components such as the antennas 206d and 306d, configuration of the coil side radio communication devices 200A and the control side radio communication devices 300A can be streamlined.

The foregoing is an explanation of the four radio communication pathways. Note that, though the case of the RF coil devices 100A is explained in the above example, in the case of the RF coil devices 100B and 100C, the power transmission and the radio communication are performed in the way similar to the case of the RF coil device 100A.

In FIG. 5, the system control unit 52 determines the imaging conditions such as a repetition time, a type of RF pulses, a center frequency of the RF pulses and a band width of the RF pulses in a pulse sequence, based on the imaging conditions inputted by a user via the input device 62. The system control unit 52 inputs the imaging conditions determined in the above manner to the pulse waveform generation unit 404.

The pulse waveform generation unit 404 generates a pulse waveform signal of baseband by using the criteria clock signal inputted from the fixed frequency generation unit 406, depending on the imaging conditions inputted from the system control unit 52 in the above manner. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 46. The RF transmitter 46 generates the RF pulses based on the inputted pulse waveform signal.

Figure 6:
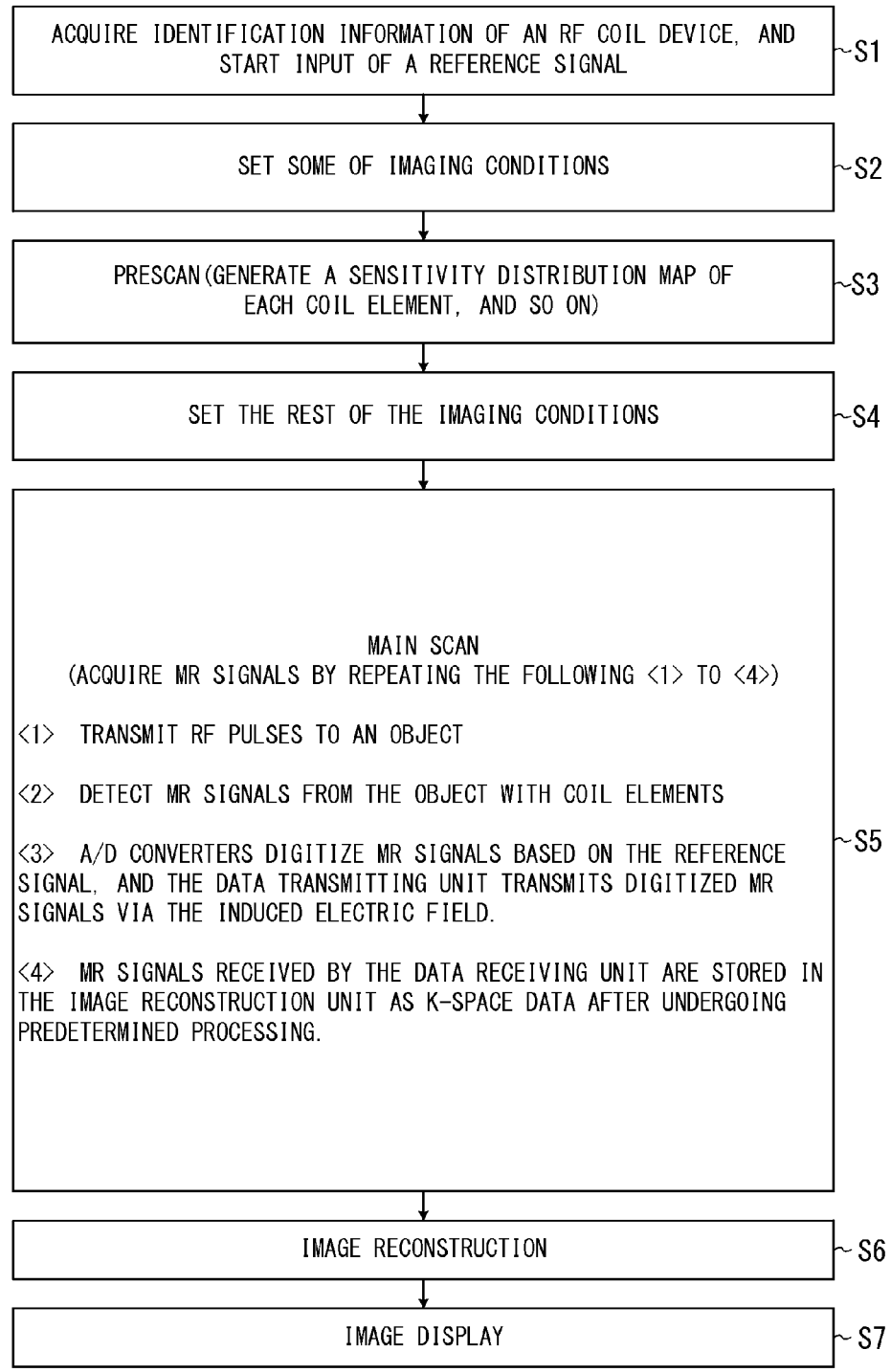
FIG. 6 is a flowchart illustrating an example of the flow of the imaging operation performed by the MRI apparatus of the first embodiment.

FIG. 6 is a flowchart illustrating an example of the flow of the imaging operation performed by the MRI apparatus 20A of the first embodiment.

Note that, though a case of using the above RF coil devices 100A, 100B and 100C will be explained here, this is only an example. The same processing as the present embodiment will be performed in the case of using other RF coil devices such as a shoulder RF coil device and in the case of using one, three, or more than three of the coil side radio communication devices 200A.

In the following, according to the step numbers in the flowchart shown in FIG. 6, the imaging operation of the MRI apparatus 20A will be described by referring to the aforementioned FIG. 1 to FIG. 5 as required.

[Step S1] The RF coil devices 100A, 100B and 100C are respectively set on the object P loaded on the table 34. Each connector 101 of the RF coil devices 100A, 100B and 100C are detachably connected to each connection port 201 of the coil side radio communication devices 200A like in FIG. 3, for example.

Each of the coil side radio communication devices 200A is detachably and closely fixed to the nearest control side radio communication device 300A on the table 34 (see FIG. 4), for example.

If the coil side radio communication device(s) 200A and the control side radio communication device(s) 300A fall within the range capable of mutual communication by the above short-distance fixation, the aforementioned electric power supply and communication are started between both sides.

More specifically, in the connection example of FIG. 3, the ID transmitting unit 222 of one of the coil side radio communication devices 200A operates based on electric power wirelessly transmitted from the ID receiving unit 322 of the control side radio communication device 300A which is the communication target, and wirelessly transmits the identification information of the RF coil device 100A to this ID receiving unit 322.

The ID transmitting unit 222 of another of the coil side radio communication devices 200A operates based on electric power wirelessly transmitted from the ID receiving unit 322 of another control side radio communication device 300A which is the communication target, and wirelessly transmits the identification information of the RF coil devices 100B and 100C to this ID receiving unit 322.

The system control unit 52 respectively acquires the identification information of these three RF coil devices 100A, 100B and 100C from the ID receiving units 322 of the respective control side radio communication devices 300A.

Thereby, the system control unit 52 recognizes which of the control side radio communication devices 300A are in connection(communication) with 'the coil side radio communication devices 200A respectively connected with the RF coil devices 100A, 100B and 100C'.

By acquiring the identification information, the system control unit 52 outputs a permission of further communication between the control side radio communication devices 300A and the coil side radio communication devices 200A fixed thereto, and makes the power supply units 320 supply electric power to the power receiving units 220.

Therefore, the power supply units 320 and the power receiving units 220 start electric power supply to each component of the coil side radio communication devices 200A and each component of the RF coil devices 100A, 100B and 100C, via the induced magnetic fields as described earlier.

In addition, the reference signal transmitting unit 318 of each of the control side radio communication devices 300A starts inputting the digital reference signal to the reference signal receiving unit 218 of each of the coil side radio communication devices 200A through the radio communication pathway between the antennas 306b and 206b, according to the communication permission outputted by the system control unit 52 (the reference signal is continuously wirelessly transmitted). Note that, the trigger signal for determining sampling timing is superimposed (added) on the transmitted reference signal.

In addition, the table driving device 50 (see FIG. 1) moves the table 34 to inside of the gantry according to the control by the system control unit 52. After this, the process proceeds to Step S2.

[Step S2] The system control unit 52 sets some of the imaging conditions of the main scan based on the imaging conditions inputted to the MRI apparatus 20A via the input device 62 and information on the currently used RF coil devices acquired in Step S1 (in this example, information indicating that the RF coif devices 100A, 100B and 100C are used). After this, the process proceeds to Step S3.

[Step S3] The system control unit 52 makes the MRI apparatus 20A perform prescans by controlling each component of the MRI apparatus 20A. In the prescans, for example, a corrected value of the center frequency of the RF pulses is calculated, and a sensitivity distribution map of each of the coil elements 106 of the RF coil devices 100A, 100B and 100C is generated. After this, the process proceeds to Step S4.

[Step S4] The system control unit 52 sets the rest of the imaging conditions based on the execution results of the prescans. The imaging conditions include information on which of the coil elements 106 are used for detection in the main scan.

Thus, the system control unit 52 inputs the information on the coil elements 106 used for the main scan into the selection control unit 108 of the RF coil device 100A via any one of the radio communication pathways. The information on the coil elements 106 used for detection in the main scan is, for example, wirelessly transmitted from the gate signal transmitting unit 324 to the gate signal receiving unit 224, and then inputted into the selection control unit 108 from the gate signal receiving unit 224. The same applies to the RF coil devices 100B and 100C. After this, the process proceeds to Step S5.

[Step S5] The system control unit 52 makes the MRI apparatus 20A perform the main scan by controlling each component thereof.

More specifically, a static magnetic field is formed in the imaging space by the static magnetic field magnet 22 excited by the static magnetic field power supply 40. In addition, electric current is supplied from the shim coil power supply 42 to the shim coil 24, and thereby the static magnetic field formed in the imaging space is uniformed.

Note that, during the implementation term of the main scan, the aforementioned gate signal is continuously transmitted between the antennas 306d and 206d from the gate signal transmitting unit 324 to the gate signal receiving unit 224.

After this, when the system control unit 52 receives a command of start of imaging from the input device 62, the MR signals from the object P are acquired (collected) by repeating the following processes of <1> to <4> in series.

<1> The system control unit 52 drives the gradient magnetic field power supply 44, the RF transmitter 46 and the RF receiver 48 according to the pulse sequence, thereby the gradient magnetic fields are formed in the imaging region including the imaging part of the object P, and the RF pulses are transmitted from the transmission RF coil 28 to the object P. Only during the transmission period of the RF pulses, the gate signal is set to, for example, on-level.

That is, the on-level gate signal is inputted from the gate signal receiving unit 224 of one of the coil side radio communication devices 200A to the selection control unit 108 the RF coil device 100A. In addition, the on-level gate signal is respectively inputted from the gate signal receiving unit 224 of the other one of the coil side radio communication devices 200A to the selection control units 108 the RF coil devices 100B and 100C.

Thereby, the coil elements 106 of the RF coil devices 100A, 100B and 100C are set to off-state so as to prevent the aforementioned coupling.

<2> Each of the gate signals is switched over to, for example, off-level after transmission of the RF pulses, and each of the coil elements 106 of the RF coil devices 100A, 100B and 100C selected for detection in the Step S4 detects the MR signals caused by nuclear magnetic resonance inside the object P. Each of the detected analog MR signals is inputted from each of the coil elements 106 to the corresponding preamplifier PMP, amplified by the corresponding preamplifier PMP, and then inputted to the corresponding A/D converter 212, respectively (see FIG. 5).

<3> Each of the A/D converters 212 corresponding to the coil elements 106 selected for detection starts sampling and quantization of the MR signals in synchronization with the timing when the trigger signal is wirelessly transmitted. Each of the A/D converters 212 inputs the digitized MR signals to the P/S converter 214, respectively.

The P/S converter 214 converts the inputted single or plural MR signal(s) into a serial signal, and inputs the serial signal to the data transmitting unit 216. The data transmitting unit 216 generates MR signals for radio transmission by performing predetermined processing on the serial signal of the MR signals, and wirelessly transmits the serial signal from the antenna 206a to the antenna 306a via induced electric fields.

More specifically, one of the coil side radio communication devices 200A is connected to the RF coil device 100A only. Thus, the P/S converter 214 of this coil side radio communication device 200A converts the MR signals detected by the coil elements 106 of the RF coil device 100A only. Therefore, the antenna 206a of this coil side radio communication device 200A wirelessly transmits the MR signals detected by the coil elements 106 inside the RF coil device 100A as the digital serial signal to the antenna 306a of the control side radio communication device 300A which is the communication target for this coil side radio communication device 200A.

The P/S converter 214 of the other one of the coil side radio communication devices 200A converts the MR signals respectively detected by the coil element(s) 106 inside the RF coil device 100B and the coil element(s) 106 inside the RF coil device 100C into one serial signal. Thus, the antenna 206a of the other one of the coil side radio communication devices 200A wirelessly transmits the MR signals detected by the coil elements 106 inside the RF coil devices 100B and 100C as the digital serial signal to the antenna 306a of the control side radio communication devices 300A which is the communication target.

<4> Each of the data receiving units 316 extracts the original digital MR signals by performing predetermined processing on the serial signal for radio transmission received by the antenna 306a.

That is, the data receiving unit 316 of one of the control side radio communication devices 300A extracts the MR signals per coil element 106 of the RF coil device 100A. The data receiving unit 316 of the other one of the control side radio communication devices 300A extracts the MR signals per coil element 106 of the RF coil devices 100B and 100C. Each of the data receiving units 316 inputs the extracted MR signals to the frequency downconversion unit 410, respectively.

The frequency downconversion unit 410 performs frequency downconversion on the inputted MR signals, and inputs the MR signals whose frequency is lowered to the signal processing unit 412.

After completion of acquisition of the MR signals detected by the coil elements 106 of the RF coil devices 100A, 100B and 100C by repeating the above <1> to <4> processes, the process proceeds to Step S6.

[Step S6] The image reconstruction unit 56 reconstructs image data by performing image reconstruction processing including Fourier transformation on the k-space data, with the use of the sensitivity distribution maps generated in the prescan. The image reconstruction unit 56 stores the reconstructed image data in the image database (see FIG. 1). After this, the process proceeds to Step S7.

[Step S7] The image processing unit 60 obtains the image data from the image database 58 and generates display image data by performing predetermined image processing on the obtained image data. The image processing unit 60 stores the display image data in the storage device 66.

Then, the system control unit 52 transmits the display image data to the display device 64, and makes the display device 64 display images indicated by the display image data.

After completion of imaging, the coil side radio communication devices 200A are detached from the control side radio communication devices 300A, respectively. When both sides are moved beyond the range capable of radio communication, the radio communication and electric power supply between both sides are concluded.

Note that, as an example in FIG. 6, the input of the reference signal starts in Step S1. However, this is only an example. For example, the input of the reference signal may start just before the prescans in Step S3 (i.e. after setting the imaging conditions in Step S2).

The foregoing is a description of the operation of the MRI apparatus 20A according to the first embodiment.

As just described, the coil side radio communication devices 200A, which are detachably connected to the conventional RF coil devices 100A, 100B and 100C for reception and perform signal processing of the radio communication of the MR signals via an induced electric field, are disposed in the first embodiment.

By using the coil side radio communication devices 200A respectively functioning as a relay devices (relay unit), the digital radio communication of MR signals with the use of the conventional RF coil devices 100A, 100B and 100C can be achieved without any change on the RF coil devices 100A, 100B and 100C.

Therefore, in the case of manufacturing MRI apparatuses capable of digital radio communication of MR signals, there is no necessity of developing a great number of RF coil devices for detecting MR signals with a function of radio transmission.

Thus, time and expense needed for development are reduced, and accordingly, it results in increased customer satisfaction.

In addition, in the first embodiment, the transmission side and the receiving side are closely fixed to each other in time of radio communication, and the radio communication via an induced electric field is performed.

Therefore, because output power of the radio communication can be more lowered than digital radio communication of conventional technology, the MRI apparatus 20A of the present embodiment easily accommodates to legal regulations in various countries.

In addition to the mutually closely-situated transmission side and receiving side, output power of the radio communication can be lowered. Therefore, the problem that the transmitted radio waves are reflected off surrounding areas and this degrades own data of radio communication does not occur. Thus, digitized MR signals can be wirelessly transmitted satisfactorily from the RF coil devices (100A, 100B and 100C) side to the control side of the MRI apparatus 20A (the RF receiver 48 side).

In addition, a plurality of the MR signals respectively detected by the plurality of the coil elements 106 are converted into a serial signal and then wirelessly transmitted. Thus, the necessary number of an antenna for transmitting the MR signals (radio communication pathway) is only one pair in each pair of the coil side radio communication device 200A and the control side radio communication device 300A, and frequency separation for preventing interference is not necessary between each of the MR signals.

On the other hand, in the remote radio communication of digital MR signals in conventional technology, the receiving side is located far away from the transmission side. Thus, in the remote radio communication of digital MR signals in conventional technology, frequency separation and time-multiplexed communication are performed, because interference such as cross talk occurs if a plurality of coil elements for receiving MR signals are simultaneously connected. In a short-distance radio communication like the first embodiment, it is not necessary to perform time-multiplexed communication.

In addition, the control side radio communication devices 300A are respectively disposed to mutually separated positions, and it is enough to fix the coil side radio communication device 200A to any one of the control side radio communication devices 300A. Thus, no matter which part of the object P an RF coil device is set on (i.e. no matter where the RF coil devices 100A, 100B and 100C are located on the table 34), the coil side radio communication device 200A and the control side radio communication device 300A can be closely fixed to each other, and accordingly MR signals can be wirelessly transmitted satisfactorily.

In addition, because (A) the electric power supply to the RF coil devices 100A, 100B and 100C, (B) the transmission of the gate signal and (C) the transmission of the trigger signal are wirelessly performed, configuration of the MRI apparatus 20A can be simplified. As a result, cost of manufacturing the MRI apparatus 20A can be reduced.

According to the aforementioned embodiment, a conventional RF coil device performing wired transmission of MR signals to a control side of an MRI apparatus can be used in a structure of wirelessly transmitting MR signals detected in an RF coil device to the control side of an MRI apparatus, without change.

As to the first embodiment, the following three supplementary notes are added.

Firstly, focusing attention on one pair of the control side radio communication device 300A and the coil side radio communication device 200A, an example in which the MR signals are transmitted between only one pair of the antennas 206*a* and 306*a* has been explained. However, embodiments of the present invention are not limited to such an aspect.

For example, the same number of the antennas 206*a* as the connection ports 201 of the coil side radio communication device 200A may be disposed in the coil side radio communication device 200A, and the same number of the antennas 306*a* as the connection ports 201 of the coil side radio communication device 200A may be disposed in the control side radio communication devices 300A.

In this case, the same number of the data transmitting units 216 and the P/S converters 214 as the connection ports 201 are respectively disposed in the coil side radio communication device 200A. Thereby, the MR signals detected by the coil elements inside one RF coil device can be converted into one serial signal so as to transmit the MR signals per RF coil device, if a plurality of RF coil devices are respectively connected with a plurality of the connection ports 201.

Secondly, an example in which the control side radio communication devices 300A are fixedly disposed on the table 34 has been explained. However, embodiments of the present invention are not limited to such an aspect.

For example, if each length of the cables 102 of the RF coil devices 100A, 100B and 100C are long enough, the control side radio communication devices 300A may be disposed on the medial wall of the air pocket of the gantry 21 (the air pocket is the imaging space).

Alternatively, the control side radio communication devices 300A may be embedded in the interior(medial) wall of the gantry 21, or they may be disposed on the entrance of the gantry 21.

Alternatively, the control side radio communication devices 300A may be disposed on the bed 32.

Thirdly, Han example in which information on the coil elements 106 used for detection of MR signals is wirelessly transmitted from the gate signal transmitting unit 324 to the side of the RF coil devices 100A, 100B and 100C before the main scan (in Step S4) and only the MR signals detected by the selected the coil elements 106 are wirelessly transmitted has been explained. However, embodiments of the present invention are not limited to such an aspect.

For example, information on the coil elements 106 used for reception may not be inputted to the RF coil devices 100A, 100B and 100C. In this case, the MR signals respectively detected by all the coil elements 106 are converted into a digital serial signal, and then wirelessly transmitted in the aforementioned manner. Then, only the MR signals detected by the coil elements 106 selected for detection are extracted from the MR signals received by the antenna 306a, and the extracted MR signals are used for image reconstruction. This point holds true for the second embodiment.

<The Second Embodiment>

In the second embodiment, not the radio communication via an induced electric field but the remote radio communication of digitized MR signals is performed. Because the MRI apparatus 20B of the second embodiment has the same structure as that of the first embodiment except the parts relevant to the radio communication method, overlapping explanation is omitted.

Figure 7:
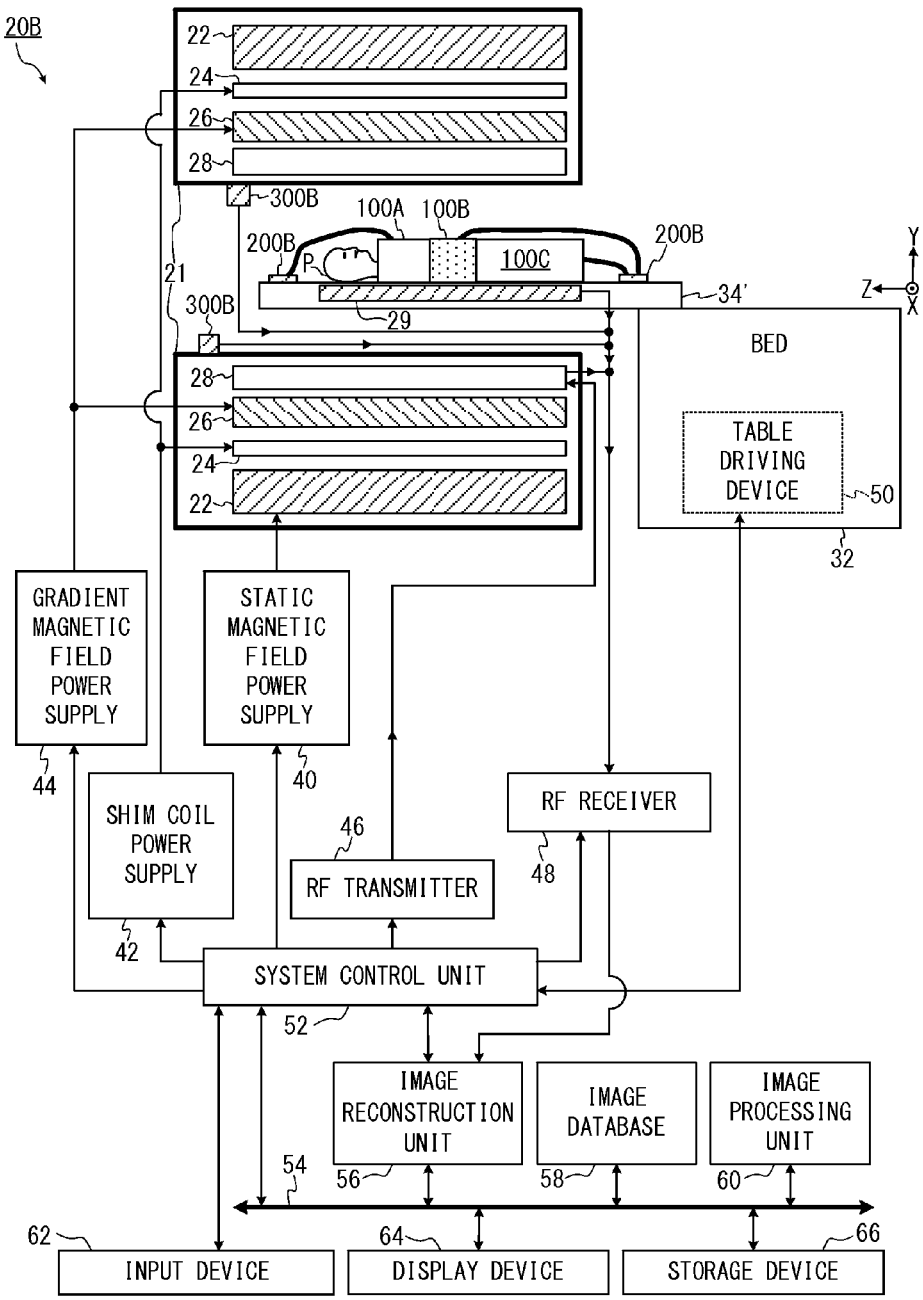
FIG. 7 is a block diagram showing an example of general structure of the MRI apparatus of the second embodiment.

FIG. 7 is a block diagram showing an example of general structure of the MRI apparatus 20B of the second embodiment. The MRI apparatus 20B includes at least two coil side radio communication devices 200B and the control side radio communication devices 300B whose number is the same as the coil side radio communication devices 200B, instead of the coil side radio communication devices 200A and the control side radio communication devices 300A in the first embodiment. Because the control side radio communication devices 300B are not disposed inside the table 34' in the second embodiment, the structure of the table 34' may be the same as a table of conventional technology.

As an example in FIG. 7, the control side radio communication devices 300B are installed (fixed) on the medial wall of the deep part of the gantry 21 in an exposed state, this is only an example. The control side radio communication devices 300B may be installed on the entrance of the gantry 21 where a phototransmitter (projector) and so on are installed. Alternatively, the control side radio communication devices 300B may be installed on the wall or the ceiling of the imaging room (shield room) where the gantry 21 is installed. The other configuration of the MRI apparatus 20B is the same as the MRI apparatus 20A in FIG. 1.

Although a case of imaging the chest part, pelvic part and the lower limbs by the RF coil devices 100A, 100B and 100C is explained as an example here, similar operation is true for a case of imaging another part by another RF coil device.

Note that, in the second embodiment, the connector 101 of the RF coil device 100A is connected to the connection port 201 of one of the coil side radio communication devices 200B, and each connector 101 of the RF coil devices 100B and 100C is connected to the connection ports 201 of the other one of the coil side radio communication devices 200B in the way similar to FIG. 3. Although these coil side radio communication devices 200B are disposed, for example, on the table 34', they may be fixed to the table 34' by a hook-and-loop fastener and so on.

Figure 8:
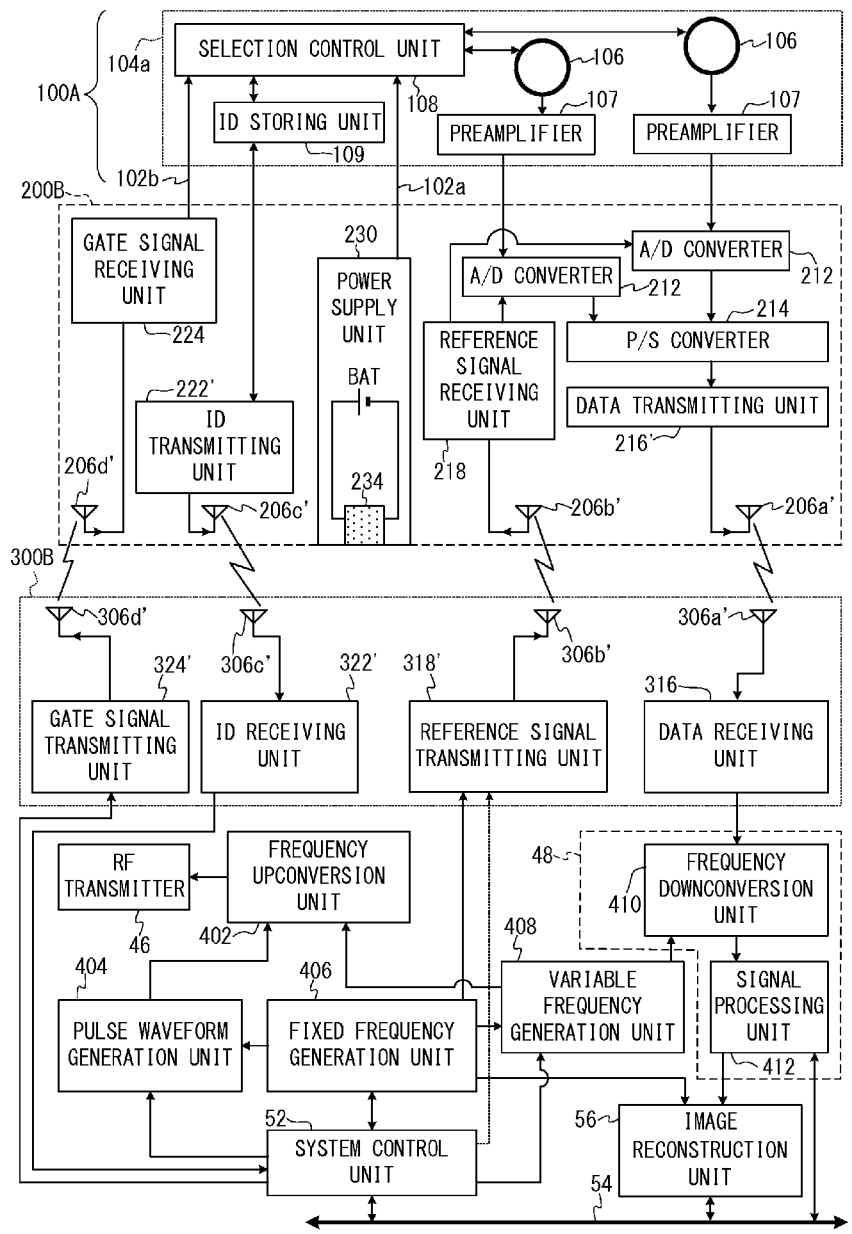
FIG. 8 is a schematic block diagram showing the functions of the respective units relevant to transmission of the MR signals detected by the coil elements of the RF coil device 100A in the second embodiment.

FIG. 8 is a schematic block diagram showing the functions of the respective units relevant to transmission of the MR signals detected by the coil elements 106 of the RF coil device 100A in the second embodiment. The structure of the coil side radio communication device 200B is the same as the coil side radio communication device 200A of the first embodiment except the following two points.

Firstly, the coil side radio communication device 200B includes the power supply unit 230 instead of the power receiving unit 220 of the first embodiment. The power supply unit 230 includes a rechargeable battery BAT and a charging connector 234. The charging connector 234 is connected to, for example, a commercial power source or a dedicated charging adapter, and supplies the rechargeable battery BAT with charging current.

That is, as an example in the second embodiment, the rechargeable battery BAT of the coil side radio communication device 200B is preliminarily charged before imaging. During imaging, the rechargeable battery BAT supplies electric power to each component of the RF coil device 100A via the power line 102a and supplies electric power to each component of the coil side radio communication device 200B via hard wiring (not shown).

Secondly, the coil side radio communication device 200B includes the antennas 206a', 206b', 206c' and 206d' for remote radio communication, instead of the antenna 206a, 206b, 206c and 206d for the short-distance radio communication in the first embodiment. In addition, the coil side radio communication device 200B includes the data transmitting unit 216' and the ID transmitting unit 222' for the remote radio communication, instead of the data transmitting unit 216 and the ID transmitting unit 222 for the short-distance radio communication in the first embodiment.

The data transmitting unit 216' generates the MR signal for digital radio communication by performing the same processing as the first embodiment on the serial signal of MR signals inputted from the P/S converter 214. Note that, the data transmitting unit 216' of the second embodiment increases the radio output power of the MR signal for digital radio communication more than the first embodiment so as to bring its output level to a level appropriate for the remote radio communication (thus, the frequency of the carrier wave may be changed to an frequency appropriate for the digital remote radio communication).

The data transmitting unit 216' inputs the MR signal (carrier wave) for the remote radio communication into the antenna 206a'. The antenna 206a' radiates the MR signal for the remote radio communication as electromagnetic waves to a space. That is, the antenna 206a' transmits the MR signal in unspecified directions by radiation electromagnetic fields.

The ID transmitting unit 222' performs not the aforementioned RFID but the remote radio communication. The ID transmitting unit 222' acquires the identification information of the RF coil device 100A from the ID storing unit 109, generates a carrier wave including the identification information of the RF coil device 100A for the remote radio communication, and inputs this carrier wave to the antenna 206c'. The antenna 206c' radiates the inputted carrier wave as electromagnetic waves to a space.

The structure of the control side radio communication device 300B is the same as the control side radio communication device 300A of the first embodiment except the following two points.

Firstly, the power supply unit 320 of the first embodiment is omitted. Note that, consumed power of the control side radio communication devices 300B is supplied from the power system (not shown) of the MRI apparatus 20B via hard wiring (not shown) in the way similar to the first embodiment.

Secondly, the control side radio communication device 300B includes the antennas 306a', 306b', 306c' and 306d' for the remote radio communication, instead of the antenna 306a, 306b, 306c and 306d for the short-distance radio communication in the first embodiment. In addition, the control side radio communication device 300B includes the reference signal transmitting unit 318', the ID receiving unit 322' and the gate signal transmitting unit 324' for the remote radio communication, instead of the reference signal transmitting unit 318, the ID receiving unit 322 and the gate signal transmitting unit 324 for the short-distance radio communication in the first embodiment.

The antenna 306c' detects the carrier wave radiated from the antenna 206c', and inputs this carrier wave into the ID receiving unit 322'. The ID receiving unit 322' extracts the identification information of the RF coil device 100A from the inputted carrier wave, and inputs the identification information into the system control unit 52. Note that, because the ID receiving unit 322' is for the remote radio communication, the ID receiving unit 322' does not perform wireless transmission of electric power to the ID transmitting unit 222'.

The reference signal transmitting unit 318' is the same as the reference signal transmitting unit 318 of the first embodiment, except that it brings the radio output power of the reference signal (on which the trigger signal is superimposed) to a level appropriate for the digital remote radio communication (note that, the frequency of the carrier wave may be changed to an frequency appropriate for the digital remote radio communication).

The gate signal transmitting unit 324' is the same as the gate signal transmitting unit 324 of the first embodiment, except that it brings the radio output power of the gate signal to a level appropriate for the digital remote radio communication (note that, the frequency of the carrier wave may be changed to an frequency appropriate for the digital remote radio communication).

Incidentally, as to the respective frequencies of the signals (carrier waves) for the remote radio communication generated by the data transmitting unit 216', the ID transmitting unit 222', the reference signal transmitting unit 318' and the gate signal transmitting unit 324', it is preferable to avoid frequencies which are equal to numbers obtained by dividing "a frequency of RF pulses transmitted to the object P" by a natural number (in the second embodiment, the respective frequencies of the carrier waves are set in such a manner).

In addition, each of the coil side radio communication devices 200B and each of the control side radio communication devices 300B perform frequency separation of the carrier waves of the remote radio communication. More specifically, the respective radio frequency values used in the four carrier waves of the remote radio communication generated by the data transmitting unit 216', the ID transmitting unit 222', the reference signal transmitting unit 318' and the gate signal transmitting unit 324' are widely separated.

In addition, in the second embodiment, the first remote radio communication is performed between one of the coil side radio communication devices 200B (which is connected to the RF coil device 100A) and one of the control side radio communication devices 300B.

At the same time, the second remote radio communication is performed between the other one of the coil side radio communication devices 200B (which is connected to the RF coil devices 100B and 100C) and the other one of the control side radio communication devices 300B. The radio communication of the latter between the RF coil devices (100B, 100C) and the control side of the MRI apparatus 20B is the same as that of the former (the radio communication between the RF coil devices 100A and the control side of the MRI apparatus 20B explained with FIG. 8).

Each of the coil side radio communication devices 200B and each of the control side radio communication devices 300B perform frequency separation of the carrier waves of the radio communication both in the first remote radio communication for the RF coil devices 100A and in the second remote radio communication for the RF coil devices 100B and 100C.

The imaging operation of the MRI apparatus 20B of the second embodiment is the same as the imaging operation of the first embodiment explained with FIG. 6, except that the aforementioned digital emote radio communication is performed instead of the digital short-distance radio communication.

As just described, in the second embodiment, a conventional RF coil device (100A, 100B or 100C) performing wired transmission of MR signals to a control side of an MRI apparatus can be used in a structure of wirelessly transmitting MR signals detected in an RF coil device to the control side of the MRI apparatus 20B, without change.

<Supplementary Notes on the First and Second Embodiments>

[1] In the second embodiment, an example in which the same number of the control side radio communication devices 300B as the coil side radio communication devices 200B are disposed and the digital remote radio communication is performed between each of the coil side radio communication devices 200B and each of the control side radio communication devices 300B has been described. However, the embodiments of the present invention are not limited to such an implementation.

For example, the number of the control side radio communication device 300B may be one. In this case, a plurality of the antennas 306a' for receiving the MR signals respectively corresponding to the plurality of the coil side radio communication devices 200B may be disposed in one control side radio communication device 300B. Similarly, the same number of the antennas 306b' as the coil side radio communication devices 200B may be disposed in one control side radio communication device 300B, The same holds true for the antennas 306c' and 306d'.

[2] In the first embodiment and the second embodiment, an example in which (as the MRI apparatuses 20A and 20B) the RF receiver 48 is disposed outside the gantry 21 has been described (see FIG. 1 and FIG. 7). However, the embodiments of the present invention are not limited to such an implementation. The RF receiver 48 may be included in the gantry 21.

More specifically, for example, an electronic circuit board that is equivalent to the RF receiver 48 may be disposed in the gantry 21. In this case, as to outputting the signal to the outside of the gantry 21 (to the image reconstruction unit 56), for example, an optical communication cable is preferably used to transmit the signal in the form of an optical digital signal. This is because the effect of external noise is reduced.

[3] In the first embodiment, an example in which the MR signals are transmitted under the short-distance digital radio communication via an induced electric field has been explained.

In the second embodiment, an example in which the MR signals are transmitted under the digital remote radio communication based on a radiation electromagnetical field has been explained. However, the embodiments of the present invention are not limited to such implementations.

The technological thought of the above embodiments can be applied to any aspect in which an MR signal is transmitted as an electromagnetic wave.

More specifically, for example, the technological thought of the above embodiments can be applied to analogue radio communication in which MR signals are wirelessly transmitted by radiating analogue electromagnetic waves as the carrier waves of the MR signals to a space and the carrier waves are received by an antenna.

Alternatively, the technological thought of the above embodiments can be applied to optical radio communication. In this case, the data transmitting unit 216 in FIG. 5 can transmit the MR signals by using light of a light-emitting diode, for example, instead of the antenna 206a, and the data receiving unit 316 can receive the light as the carrier waves of the MR signals with a light receiving element, for example. Alternatively, the MR signals can be transmitted by infrared light as the carrier waves, and the MR signals can be received with a light receiving element.

[4] Correspondences between terms used in the claims and terms used in the embodiment described above will be described. Note that the correspondences described below are just some of possible interpretations for reference and should not be construed as limiting the present invention.

The coil side radio communication devices 200A and 200B are examples of the first radio communication unit and the radio communication device described in the claims.

The connection port 201 is an example of the connecting unit described in the claims.

The A/D converters 212, the P/S converter 214, the data transmitting unit 216 and the antenna 206a of each of the coil side radio communication devices 200A and 200B are examples of the radio communication unit described in the claims.

The control side radio communication devices 300A and 300B are examples of the second radio communication unit described in the claims.

The coil elements 106 are examples of the coil unit described in the claims.

Each connector 101 is an example of the connector unit described in the claims.

[5] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus providing nuclear magnetic resonance signals from an MRI RF (radio frequency) coil device including a wired cable end connector, said RF coil device being configured to detect the nuclear magnetic resonance signals emitted from an object and output the nuclear magnetic resonance signals through a wired transmission with the wired cable end connector, the magnetic resonance imaging apparatus comprising:

a table configured to have placed thereon the object during the detecting of nuclear magnetic resonance signals emitted from the object;

at least one transmission converter configured to convert the wired transmission of the MRI RF coil device into a wireless transmission, by including a receptor connector into which the wired cable end connector of the RF coil device is fitted, acquiring the nuclear magnetic resonance signals detected by the RF coil device via the receptor connector, and wirelessly transmitting the nuclear magnetic resonance signals, wherein the at least one transmission converter is configured to be disposed on a top surface of the table during said wirelessly transmitting;

a radio communication receiver disposed behind the top surface of the table and configured to receive the nuclear magnetic resonance signals wirelessly transmitted from the transmission converter; and an image reconstruction unit configured to acquire the nuclear magnetic resonance signals received by the radio communication receiver, and reconstruct image data of the object based on the acquired nuclear magnetic resonance signals.

2. The magnetic resonance imaging apparatus according to claim 1,
wherein the transmission converter is configured to be connected to the RF coil device via the receptor connector with a fixed line.

3. The magnetic resonance imaging apparatus according to claim 2,
wherein the transmission converter includes a plurality of receptor connectors detachably connected to a plurality of RF coil devices respectively.

4. The magnetic resonance imaging apparatus according to claim 3, comprising a plurality of transmission converters each of which includes a respective receptor connector, acquires the nuclear magnetic resonance signal detected by the RF coil device via the respective receptor connector and wirelessly transmits the nuclear magnetic resonance signal.

5. The magnetic resonance imaging apparatus according to claim 4,
wherein the transmission converters are configured to wirelessly transmit nuclear magnetic resonance signals in a digitized state via induced electric fields; and
the radio communication receiver is configured to receive the nuclear magnetic resonance signals wirelessly transmitted from the transmission converters via the induced electric fields.

6. The magnetic resonance imaging apparatus according to claim 4,
wherein the transmission converters are configured to include antennas respectively, and wirelessly transmit nuclear magnetic resonance signals in a digitized state by radiating electromagnetic waves to a space from the antennas.

7. The magnetic resonance imaging apparatus according to claim 1,
wherein the transmission converter includes a plurality of receptor connectors detachably connected to a plurality of RF coil devices respectively by wired cable end connectors.

8. The magnetic resonance imaging apparatus according to claim 7, comprising a plurality of transmission converters each of which includes at least one receptor connector, acquires the nuclear magnetic resonance signals detected by the RF coil device via the receptor connector and wirelessly transmits the nuclear magnetic resonance signals.

9. The magnetic resonance imaging apparatus according to claim 8,
wherein the transmission converters are configured to wirelessly transmit nuclear magnetic resonance signals in a digitized state via induced electric fields; and
the radio communication receiver is configured to receive the nuclear magnetic resonance signals wirelessly transmitted from the transmission converters via the induced electric fields.

10. The magnetic resonance imaging apparatus according to claim 1, comprising a plurality of transmission converters each of which includes at least one receptor connector, acquires the nuclear magnetic resonance signals detected by the RF coil device via the receptor connector and wirelessly transmits the nuclear magnetic resonance signals.

11. The magnetic resonance imaging apparatus according to claim 10,
wherein the transmission converters are configured to wirelessly transmit nuclear magnetic resonance signals in a digitized state via induced electric fields; and
the second radio communication unit is configured to receive the nuclear magnetic resonance signals wirelessly transmitted from the transmission converters via the induced electric fields.

12. The magnetic resonance imaging apparatus according to claim 1,
wherein the transmission converter is configured to wirelessly transmit the nuclear magnetic resonance signals in a digitized state via an induced electric field; and
the radio communication receiver is configured to receive the nuclear magnetic resonance signals wirelessly transmitted from the transmission converter via the induced electric field.

13. The magnetic resonance imaging apparatus according to claim 1,
wherein the transmission converter is configured to include an antenna, and wirelessly transmit the nuclear magnetic resonance signals in a digitized state by radiating an electromagnetic wave to a space from the antenna.

\* \* \* \* \*